United States Patent [19]

Saito et al.

[11] Patent Number: 4,754,319
[45] Date of Patent: Jun. 28, 1988

[54] IC CARD AND METHOD FOR MANUFACTURING THE SAME

[75] Inventors: Tamio Saito; Masayuki Ohuchi, both of Tokyo; Hirosi Oodaira, Chigasaki; Yoshikatsu Fukumoto, Tokyo; Shuji Hiranuma, Kawasaki; Ko Kishida, Nara; Takanori Kisaka, Yao, all of Japan

[73] Assignees: Kabushiki Kaisha Toshiba, Kawasaki; Shoei Printing Company Limited, Oosaka, both of Japan

[21] Appl. No.: 97,338

[22] Filed: Sep. 11, 1987

Related U.S. Application Data

[63] Continuation of Ser. No. 738,186, May 28, 1985, abandoned.

[30] Foreign Application Priority Data

May 30, 1984 [JP] Japan .................. 59-108628

[51] Int. Cl.$^4$ .................. H01L 23/28; H01L 23/06; G06K 19/06
[52] U.S. Cl. .................. 357/72; 357/80; 235/492
[58] Field of Search .................. 357/72, 80; 235/492

[56] References Cited

U.S. PATENT DOCUMENTS

| | | | |
|---|---|---|---|
| 4,463,971 | 8/1984 | Hoppe et al. | 235/492 |
| 4,532,419 | 7/1985 | Takeda | 235/492 |
| 4,563,575 | 1/1986 | Hoppe et al. | 235/492 |

Primary Examiner—Andrew J. James
Assistant Examiner—John Lamont
Attorney, Agent, or Firm—Oblon, Fisher, Spivak, McClelland & Maier

[57] ABSTRACT

In an IC card according to the present invention, a base sheet formed of thermoplastic material is sandwiched between a substrate sheet and a dummy sheet both formed of nonplastic material lower in thermoplasticity than the base sheet. The substrate sheet is fitted with at least one IC chip and input/output terminals electrically connected to the IC chip. First and second cover sheets formed of thermoplastic material are put individually on the outer surfaces of the substrate sheet and the dummy sheet. The cover sheet on the substrate sheet is formed with apertures through which the input/output terminals are exposed to the outside.

9 Claims, 5 Drawing Sheets

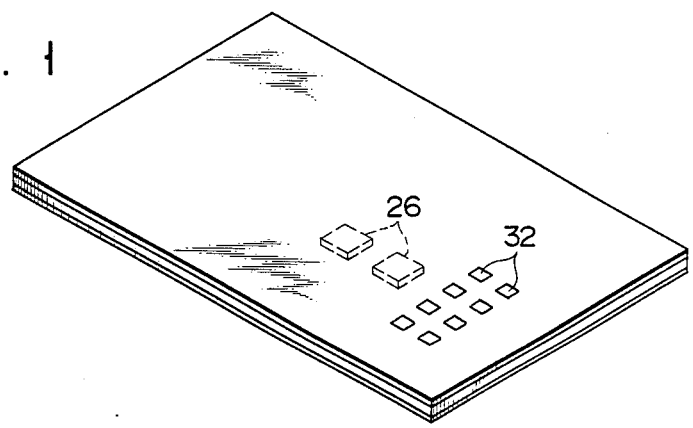
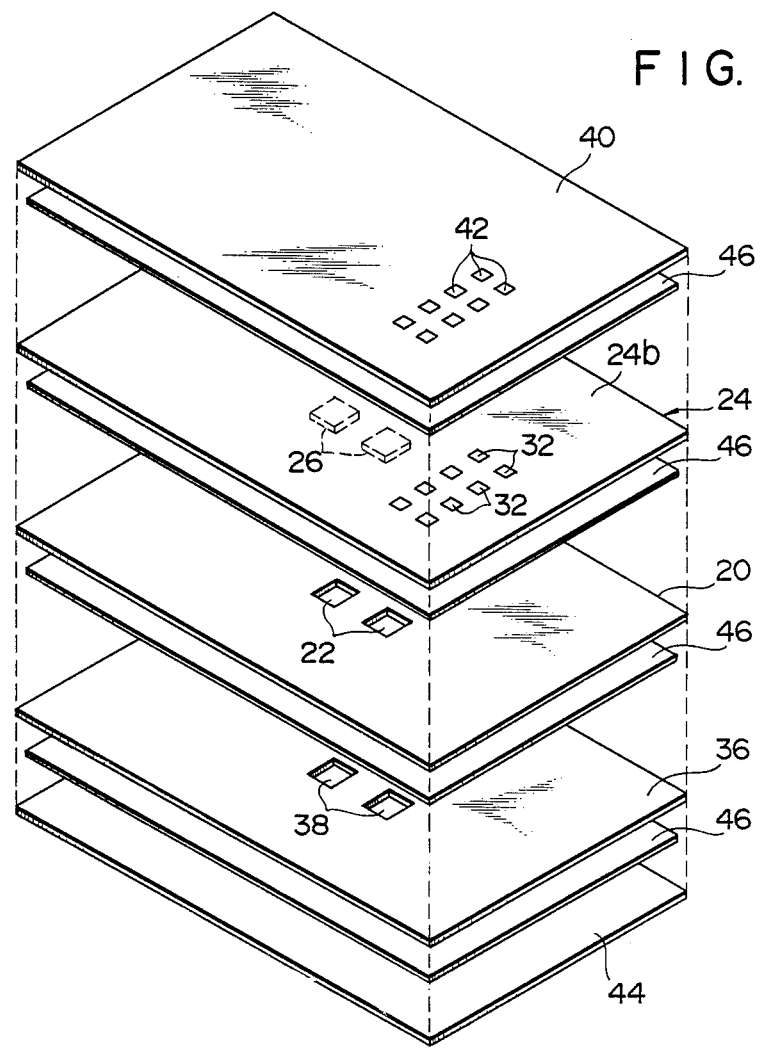

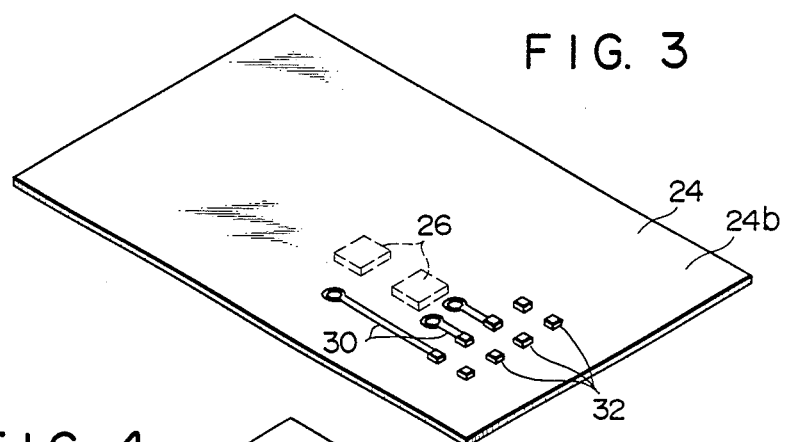
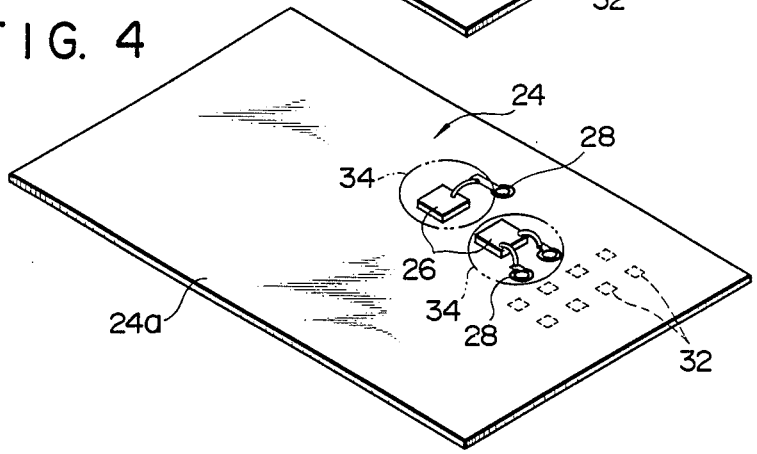
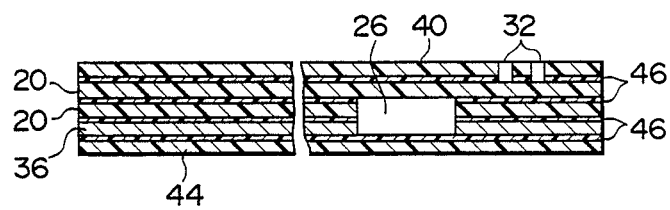
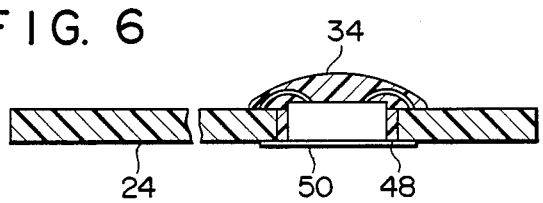

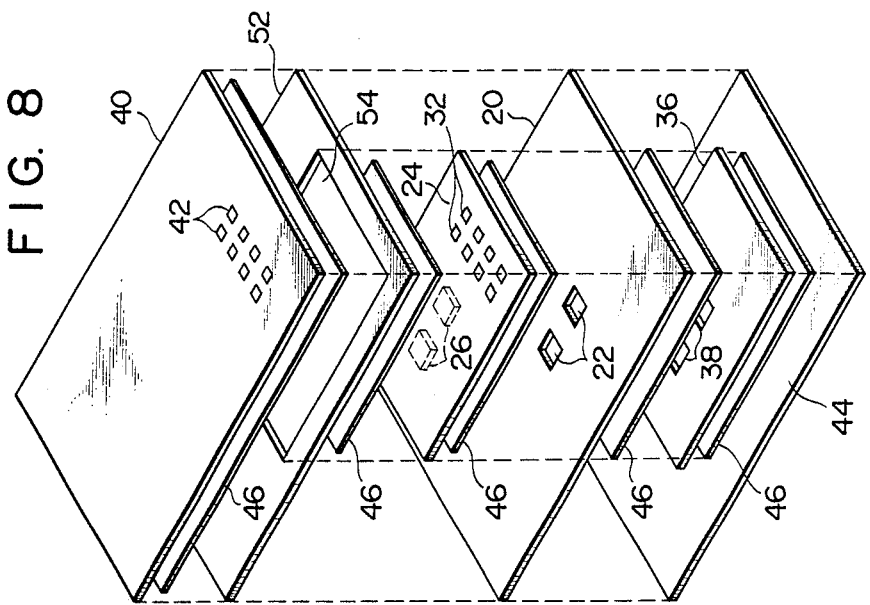
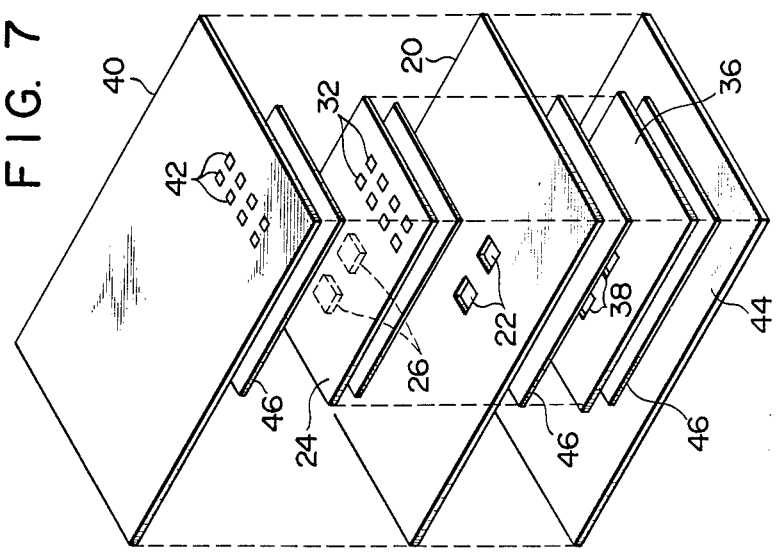

IC CARD AND METHOD FOR MANUFACTURING THE SAME

This application is a continuation of application Ser. No. 738,186, filed on May 28, 1982, now abandoned.

BACKGROUND OF THE INVENTION

The present invention relates to an IC (integrated circuit) card containing an IC chip, and more specifically to an IC card having a substrate fitted with an IC chip.

Nowadays, magnetic cards are being widely used as debit cards or credit cards. The magnetic cards are each formed of a card-shaped base and a magnetic tape attached to one surface of the base. Each magnetic card stores in its magnetic tape various pieces of information, such as data for identifying the holder of the card. Thus, by the use of the magnetic card, the card holder can operate a cash dispenser or make purchases without paying in cash.

It is already evident that the magnetic cards have various advantages. However, the magnetic tape on each magnetic card is limited in memory capacity and is therefore in application.

In consideration of these circumstances, IC cards have recently been proposed which incorporate an IC chip in place of the magnetic tape. The IC cards of this type are disclosed in U.S. Pat. No. 4,380,699, Japanese patent publication No. 6491/78, and Japanese patent Disclosure No. 221478/83. In any of these conventional IC cards, however, the IC chip cannot be protected satisfactorily. In view of reliability, therefore, the prior art IC cards are not fit for practical use.

SUMMARY OF THE INVENTION

The present invention is contrived in consideration of these circumstances, and has for its first object an IC card capable of satisfactory protection of IC chips and suited for practical use, and for its second object a method for manufacturing the IC card.

The first object of the present invention may be achieved by an IC card which comprises a base sheet formed of thermoplastic material and having first and second surfaces, a substrate sheet formed of nonplastic material lower in thermoplasticity than the base sheet and put on the first surface of the base sheet, the substrate sheet including at least one IC chip and input/output terminals electrically connected to the IC chip, the input/output terminals projecting from the other surface of the substrate sheet opposite to one surface thereof facing the base sheet, a dummy sheet formed of nonplastic material similar to that of the substrate sheet and put on the second surface of the base sheet, a first cover sheet formed of thermoplastic material and attached to the other surface of the substrate sheet, the first cover sheet having apertures as many as the input/output terminals through which the input/output terminals are exposed to the outside, and a second cover sheet formed of thermoplastic material and attached to the other surface of the dummy sheet opposite to one surface thereof facing the base sheet.

According to the IC card of the invention, the individual sheets on either side of the base sheet are arranged so that the material distribution of the IC card is symmetrical with respect to the base sheet. Therefore, the mechanical strength distribution of the IC card is also symmetrical with respect to the base sheet. Thus, the IC card may be protected against warpping or other deformation even after prolonged use. Since the substrate sheet including the IC chip is sandwiched between the base sheet and the first cover sheet, the IC chip can be satisfactorily protected and securely prevented from being damaged during use. Thus, the IC card may be improved in reliability.

The second object of the invention may be achieved by a method for manufacturing an IC card, which comprises a first bonding process including steps of attaching a substrate sheet formed of nonplastic material to one surface of a base sheet formed of thermoplastic material through a first sheetlike thermosensitive adhesive film, the substrate sheet being lower in thermoplasticity than the base sheet, attaching a dummy sheet formed of nonplastic material similar to that of the substrate sheet to the other surface of the base sheet through a second sheetlike thermosensitive adhesive film, and heating and pressing the three sheets for integration, thereby forming an intermediate plate, the substrate sheet including at least one IC chip and input/output terminals electrically connected to the IC chip, the input/output terminals projecting from the other surface of the substrate sheet opposite to one surface thereof facing the base sheet, and a second bonding process including steps of attaching a first cover sheet formed of thermoplastic material to one surface of the intermediate plate on the substrate sheet side through a third sheetlike thermosensitive adhesive film, attaching a second cover sheet formed of thermoplastic material to the other surface of the intermediate plate on the dummy sheet side through a fourth sheetlike thermosensitive adhesive film, and heating and pressing the intermediate plate and the first and second cover sheets for integration, each of the third thermosensitive adhesive film and the first cover sheet having apertures as many as the input/output terminals through which the input/output terminals are passed.

According to the above-mentioned method for manufacturing the IC card, the sheets, in either of the two bonding processes, are heated and pressed after being joined together so that the material distribution of the IC card is symmetrical with respect to the base sheet. Therefore, the intermediate plate is prevented from warping in each process, so that the resultant IC card as a finished product is improved in flatness. This would lead to good mechanical and electrical matching between the IC card of the present invention and a cash dispenser which should be a typical application for the IC card. Thus, the IC card is improved in reliability.

In the manufacture of the IC card of the invention, moreover, the components of the IC card are joined together not at a stretch but by two steps or in two bonding processes. Therefore, unevenness of the bonding surfaces of the sheets can be absorbed by the sheetlike thermosensitive adhesive films. Thus, both surfaces of the IC card as a finished product may be improved in flatness.

BRIEF DESCRIPTION OF THE DRAWINGS

FIG. 1 is a perspective view schematically showing an IC card according to a first embodiment of the present invention;

FIG. 2 is an exploded perspective view of the IC card of FIG. 1;

FIG. 3 is a perspective view showing one surface of a substrate sheet;

FIG. 4 is a perspective view showing the other surface of the substrate sheet;

FIG. 5 is a sectional view of the IC card of FIG. 1;

FIG. 6 is a sectional view showing a modified example of the substrate sheet of FIG. 1;

FIG. 7 is an exploded perspective view of an IC card according to a second embodiment of the invention;

FIG. 8 is an exploded perspective view of an IC card according to a third embodiment of the invention;

DETAILED DESCRIPTION OF THE PREFERRED EMBODIMENTS

Figure 9:
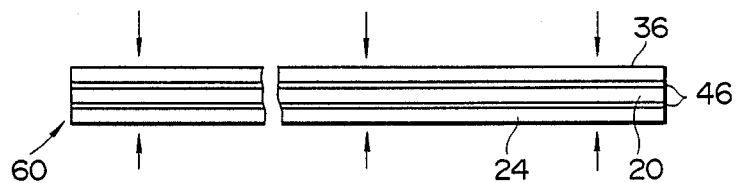
FIGS. 9 to 12 show several processes for manufacturing the IC card of FIG. 2 in regular order.

Referring now to FIG. 1, there is shown an IC (integrated circuit) card according to a first embodiment of the present invention. The IC card comprises a base sheet 20 formed of thermoplastic material, such as polyvinyl chloride or a copolymer mainly composed of polyvinyl chloride. The thickness of the base sheet 20 may range from 0.3 to 0.8 mm. Two apertures 22 are formed in predetermined portions of the base sheet 20. Put on one surface or upper surface (FIG. 2) of the base sheet 20 is a substrate sheet 24 formed of nonplastic material, such as glass-reinforced epoxy resin, glass-reinforced triazine-based resin or other thermosetting resin, which is lower in thermoplasticity than the material of the base sheet 20. The substrate sheet 24, whose shape and size are the same as those of the base sheet 20, has a thickness ranging from 0.10 to 0.25 mm. Namely, the substrate sheet 24 is thinner than the base sheet 20. As best seen from FIG. 4, two IC chips 26 are mounted on one surface 24a of the substrate sheet 24 which faces the base sheet 20. The IC chips 26 are electrically connected by wire bonding to printed-wiring strips and through holes 28 in the substrate sheet 24 on the side of the one surface 24a. As shown in FIG. 3, the through holes 28 are electrically connected to input/output terminals 32 on the other surface 24b of the substrate sheet 24 by means of printed-wiring strips 30 formed on the other surface 24b.

In FIGS. 3 and 4, the connection between the IC chips 26 and the input/output terminals 32 by means of the printed-wiring strips 30 is illustrated only schematically. As indicated by two-dot chain lines in FIG. 4, the chips 26 mounted on the substrate plate 24 are embedded and sealed individually in guard members 34 which are formed of thermosetting synthetic resin such as epoxy resin. Thus, the electrical connection between the IC chips 26 and the through holes 28 can securely be maintained. Here it is to be noted that the apertures 22 in the base sheet 20 are large enough to allow insertion of the IC chips 26 to be embedded in the guard members 34.

A dummy sheet 36 formed of nonplastic material similar to the material of the substrate sheet 24 is put on the other surface of the base sheet 20. The dummy sheet 36 also has the same shape and size as the base sheet 20. To minimize the overall thickness of the IC card, the dummy sheet 36 preferably is thinner than the substrate sheet 24. In this embodiment, for example, the thickness of the dummy sheet 36 is about 0.05 mm. Like the substrate sheet 24, the dummy sheet 36 is formed of a nonplastic material which is lower in thermoplasticity than the material of the base sheet 20. In this embodiment, the dummy sheet 36 is a metal sheet made of copper, molybdenum, or tungsten. However, the dummy sheet 36 is not limited to the metal sheet, and may also be made of polyimide resin or glass. Alternatively, the dummy sheet 36 may be formed of a porous sheet.

Further, the dummy sheet 36 is formed with two apertures 38 which correspond in position to the apertures 22 of the base sheet 20. The apertures 38 are large enough to receive the IC chips 26 which, embedded in the guard members 34, may project from the other surface of the base plate 20 in some cases. Thus, when the base sheet 20 and the dummy sheet 36 are joined together, their bonding surfaces can securely be brought close to each other. It is to be understood that the apertures 38 of the dummy sheet 36 may be omitted if the IC chips 26 embedded in the guard members 34 do not project from the other surface of the base sheet 20.

A first cover sheet 40 formed of thermoplastic material, such as polyvinyl chloride, is put on the other surface 24b of the substrate sheet 24. The first cover sheet 40 has the same shape and size as the substrate sheet 24 and a thickness ranging from 0.05 to 0.1 mm. The first cover sheet 40 is formed with apertures 42 through which the input/output terminals 32 on the substrate sheet 24 are exposed to the outside. Thus, the input/output terminals 32 can be electrically connected to external equipment such as a read/write device.

A second cover sheet 44 of the same size and material as the first cover sheet 40 is put on the surface of the dummy sheet 36 opposite to that surface thereof which faces the base plate 20. The second cover sheet 44 has no apertures.

The sheets 20, 24, 36, 40 and 44 are heated to 160° to 250° C. and pressed to be bonded to one another for integration. Thus, the IC card is completed. In this case, sheetlike thermosensitive adhesive films 46 are interposed between the individual sheets, as shown in FIG. 2, thereby ensuring the bond between the sheets. The thermosensitive adhesive films 46 are smaller than the sheets so that the former may not project from the latter when they are joined together. Moreover, the thermosensitive adhesive film 46 between the first cover sheet 40 and the substrate sheet 24 is formed with apertures (not shown) adapted to be penetrated by the input/output terminals 32, while the thermosensitive adhesive film 46 between the base sheet 20 and the dummy sheet 36 has apertures (not shown) similar to the apertures 22 and 38, if need be.

In the IC card according to the first embodiment, the sheets on either side of the base sheet 20 are arranged so that their material distribution is symmetrical with respect to the base sheet 20. Accordingly, the IC card is uniform in mechanical strength on either side of the base sheet 20, and can therefore be prevented from warping after prolonged use. Also, the IC chips 26 can be protected securely. Since the base sheet 20 and the dummy sheet 36 are formed respectively with the apertures 22 and 38 to be penetrated by the IC chips 26 embedded in the guard members 34, the IC card can have an overall thickness substantially equal to that of a prior art magnetic card even though the IC chips 26 are mounted on the substrate sheet 24. Thus, the IC card can be used also as a magnetic card if a magnetic tape is attached to the surface of one cover sheet of the card. Further, the apertures 22 and 38 in the base sheet 20 and the dummy sheet 36 serve to improve the flatness of the two surfaces of the IC card despite the existence of the IC chips 26 therein.

The present invention is not limited to the first embodiment described above. Referring now to FIG. 6, there is shown a modified example of the substrate sheet 24 according to the first embodiment. The substrate sheet 24 of FIG. 6 is formed with an aperture 48 to contain the IC chips 26. A thin metal sheet 50 for closing the aperture 48 is attached to the other surface 24b of the substrate sheet 24. The metal sheet 50, which may be made of aluminum or stainless steel, has a thickness of about 10 to 50 microns. Thus, the IC chip 26 embedded in the guard member 34 can be held in the aperture 48 of the substrate sheet 24 by the metal sheet 50, so that the substrate sheet 24 and hence the IC card can further be reduced in overall thickness.

FIGS. 7 and 8 show IC cards according to second and third embodiments of the present invention, respectively. In the description of the second and third embodiments to follow, like reference numerals are used to designate like components as included in the IC card of the first embodiment, and a description of those similar components is omitted.

In the second embodiment shown in FIG. 7, the substrate sheet 24 and the dummy sheet 36 are smaller than the base sheet 20 and the first and second cover sheets 40 and 44. Here it is to be understood that the base sheet 20 and the first and second cover sheets 40 and 44 are of the same size, while the substrate sheet 24 and the dummy sheet 36 are substantially equal in size. The size of the thermosensitive adhesive films 46 is reduced to match the size of the substrate sheet 24 and the dummy sheet 36. In the case of this second embodiment, the IC card is warped less than the IC card of the first embodiment when the sheets are heated and pressed for integration. Since the substrate sheet 24 and the dummy sheet 36 formed of nonplastic material are smaller than the base sheet 20 and the first and second cover sheets 40 and 44 formed of thermoplastic material, the difference in thermal contraction between the sheets of different materials can be absorbed by the sheets 20, 40 and 44 which are higher in thermoplasticity. Thus, the warp of the IC card can be minimized.

In the case of the second embodiment, it has been revealed that the warp of the IC card as a finished product is minimized when the base plate 20 and the first and second cover sheets 40 and 44 formed of polyvinyl chloride are 54 mm×84 mm in size, the base sheet 20 is 0.4 mm in thickness, each of the first and second cover sheets 40 and 44 is 0.06 mm in thickness, the substrate sheet 24 formed of glass-reinforced triazine-based resin is 22 mm×44 mm in size and 0.15 mm in thickness, and the dummy sheet 36 formed of copper is 24 mm×46 mm in size and 0.035 mm in thickness.

The third embodiment shown in FIG. 8 has basically the same construction as the second embodiment. The former differs from the latter in that the IC card of the third embodiment further comprises a buffer sheet 52 formed of, e.g., polyvinyl chloride. The buffer sheet 52 has the same size as the base sheet 20 and is substantially as thick as the substrate sheet 24. The buffer sheet 52 is formed with an opening 54 in which the substrate sheet 24 can be fitted. Thus, as seen from FIG. 8, the buffer sheet 54 is located between the base sheet 20 and the first cover sheet 40. An additional sheetlike thermosensitive adhesive film 46 is interposed between the buffer sheet 52 and the first cover sheet 40. According to the third embodiment constructed in this manner, the substrate sheet 24 can be housed in the opening 54 of the buffer sheet 52, so that the surface of the first cover sheet 40 through which the input/output terminals 32 are exposed when the IC card is completed can be made flat.

Referring now to FIGS. 9 to 12, a method for manufacturing the IC card shown in FIG. 2 will be described.

First, as shown in FIG. 9, the base sheet 20, the substrate sheet 24, and the dummy sheet 36 are joined together so that the base sheet 20 is sandwiched between the other two. In doing this, the thermosensitive adhesive films 46 are naturally interposed between the sheets. In this state, the substrate sheet 24, the base sheet 20, and the dummy sheet 36 are heated to 160° to 250° C. and pressed. As a result, the three sheets 24, 20 and 36 are bonded to one another for integration to form a first intermediate plate 60.

Figure 10:
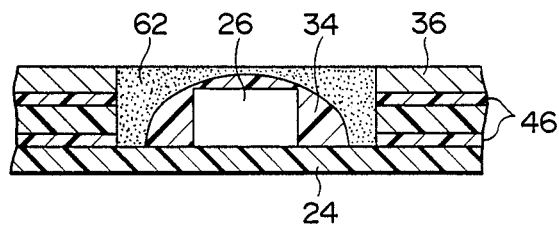
Figure 11:
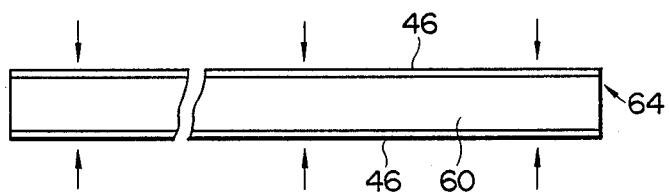
Figure 12:
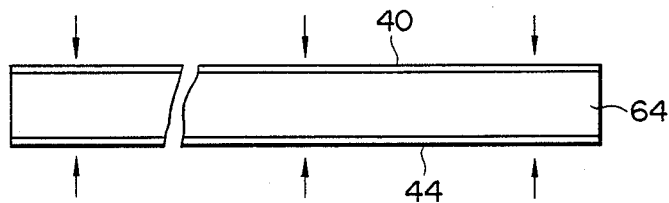

If there are gaps between the inner surfaces of the apertures 22 and 38 of the base sheet 20 and the dummy sheet 36 and the outer surfaces of the IC chips 26 or the guard members 34 in the apertures 22 and 38 when the intermediate plate 60 is formed in the aforesaid manner, then the gaps are filled up with polyvinyl chloride powder 62 or copolymer powder mainly composed of polyvinyl chloride, as shown in FIG. 10.

Subsequently, the thermosensitive adhesive films 46 are put on both surfaces of the first intermediate plate 60 to form a second intermediate plate 64.

Thereafter, the first and second cover sheets 40 and 44 are put individually on both surfaces of the second intermediate plate 64, and the plate 64 and the sheets 40 and 44 are then heated again to 160° to 250° C. and pressed. In consequence, the second intermediate plate 64 and the first and second cover sheets 40 and 44 are bonded to one another for integration to complete the IC card. In this process, the powder filling the gaps is melted by heating, thereby stopping up the gaps.

According to the above-mentioned method for manufacturing the IC card, the individual sheets are arranged so that the material distribution of the resultant structure is symmetrical with respect to the base sheet 20 in each bonding process described above. Therefore, the thermal contraction differences on both sides of the base sheet 20 are substantially equivalent. Thus, in the processes for forming the intermediate plate 60 and the IC card, these plates and card can be prevented from warping.

Figure 13:
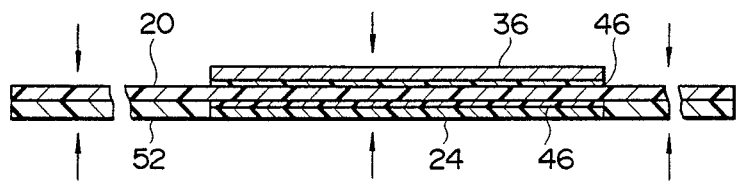
FIGS. 13 to 16 show several processes for manufacturing the IC card of FIG. 8 in regular order.
Figure 14:
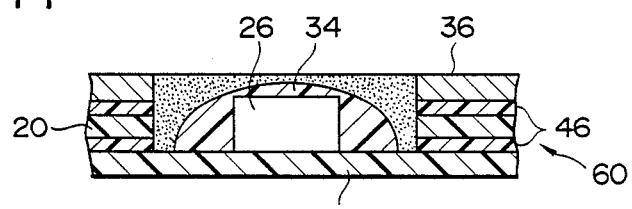

Referring now to FIGS. 13 to 16, there is illustrated a method for manufacturing the IC card shown in FIG. 8. The IC card of FIG. 8 is manufactured following processes similar to those for the IC card of FIG. 2. As shown in FIG. 13, the substrate sheet 24 and the dummy sheet 36 are put individually on both sides of the base sheet 20, the buffer sheet 52 is further put on the base sheet 20, and these sheets are bonded to one another for integration to form the first intermediate plate 60. Then, as shown in FIG. 14, the gaps inside the apertures 22 and 38 are filled up, as required, with the powder 62 of thermoplastic synthetic resin.

Figure 15:
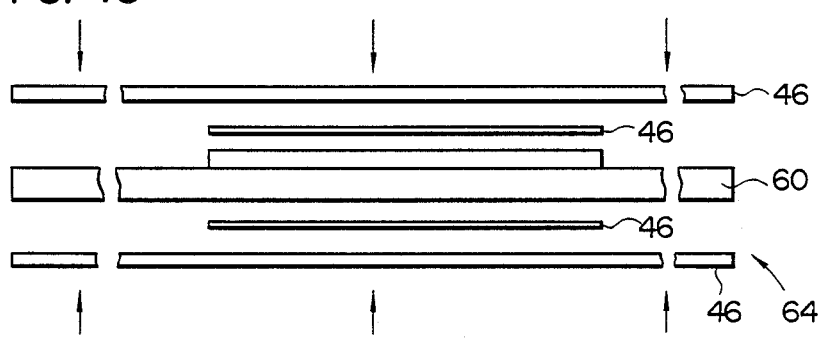

Subsequently, as shown in FIG. 15, the thermosensitive adhesive films 46 are put on both surfaces of the first intermediate plate 60 to form the second intermediate plate 64. In this case, two sheetlike thermosensitive adhesive films 46 are put on each surface of the first intermediate plate 60 in order to absorb the projection of the dummy sheet 36 from the surface of the base sheet 20 and the projection or recess of the substrate sheet 24 from the surface of the buffer sheet 52.

Figure 16:
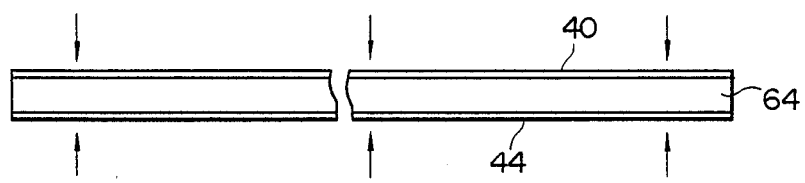

Thereafter, as shown in FIG. 16, the first and second cover sheets 40 and 44 are put individually on both surfaces of the second intermediate plate 64, and the plate 64 and the sheets 40 and 44 are bonded to one another for integration to complete the IC card.

Although the IC chips 26 and the printed-wiring strips are connected by wire bonding in the embodiments described above, the present invention is not limited to those embodiments, and various changes and modifications may be effected therein. For example, flip chips may be used to permit direct connection with the printed-wire strips.

What is claimed is:

1. An IC card comprising:
   a base sheet formed of thermoplastic material and having first and second surfaces;
   a substrate sheet formed of nonplastic material lower in thermoplasticity than the base sheet and put on the first surface of the base sheet, said substrate sheet including at least one IC chip and input/output terminals electrically connected to the IC chip, the input/output terminals projecting from the other surface of the substrate sheet opposite to one surface thereof facing said base sheet;
   a dummy sheet formed of nonplastic material similar to that of said substrate sheet and put on the second surface of said base sheet;
   a first cover sheet formed of thermoplastic material and attached to the other surface of said substrate sheet, said first cover sheet having apertures as many as the input/output terminals through which the input/output terminals are exposed to the outside; and
   a second cover sheet formed of thermoplastic material and attached to the other surface of said dumy sheet opposite to one surface thereof facing said base sheet; and
   wherein said dummy sheet and said base sheet extend to the edges of said IC card.

2. The IC card according to claim 1, wherein the IC chip is mounted on the one surface of said substrate sheet, and said substrate sheet includes first printed wiring means arranged on the one surface thereof so as to be electrically connected to the IC chip by wire bonding and second printed wiring means arranged on the other surface so as to be electrically connected to the input/output terminals, the first and second printed wiring means being electrically connected via through holes formed in said substrate sheet.

3. The IC card according to claim 2, wherein the IC chip and wires connected to the IC chip are embedded in a guard member formed of thermosetting synthetic resin.

4. The IC card according to claim 3, wherein said base sheet is formed with an aperture for containing the IC chip embedded in the guard member.

5. The IC card according to claim 4, wherein a gap inside the aperture of the base sheet containing the IC chip embedded in the guard member is filled with thermoplastic synthetic resin.

6. The IC card according to claim 3, wherein said substrate sheet is formed with a recess for containing the IC chip embedded in the guard member.

7. The IC card according to claim 6, wherein a gap inside the recess of the substrate sheet containing the IC chip embedded in the guard member is filled with thermoplastic synthetic resin.

8. The IC card according to claim 1, wherein said substrate sheet and said dummy sheet are smaller than the first and second cover sheets.

9. The IC card according to claim 8, wherein a buffer sheet formed of thermoplastic material is disposed between the base sheet and the first cover sheet, said buffer sheet being of the same size as the first cover sheet and having an opening in which the substrate sheet is fitted.

* * * * *